(12) United States Patent
Choi et al.

(10) Patent No.: US 7,932,543 B2
(45) Date of Patent: Apr. 26, 2011

(54) WIRE STRUCTURE AND SEMICONDUCTOR DEVICE COMPRISING THE WIRE STRUCTURE

(75) Inventors: Sang-jun Choi, Yongin-si (KR);
Jung-hyun Lee, Yongin-si (KR);
Hyung-jin Bae, Seoul (KR); Chang-soo Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 531 days.

(21) Appl. No.: 12/005,364

(22) Filed: Dec. 27, 2007

(65) Prior Publication Data

US 2008/0169118 A1 Jul. 17, 2008

(30) Foreign Application Priority Data

Jan. 12, 2007 (KR) .................. 10-2007-0003965

(51) Int. Cl.
*H01L 27/10* (2006.01)

(52) U.S. Cl. . 257/202; 257/211; 257/390; 257/E23.144; 257/E29.33; 257/E29.17; 977/762; 977/765; 977/940; 977/732; 174/126.1

(58) Field of Classification Search ........................ None
See application file for complete search history.

(56) References Cited

U.S. PATENT DOCUMENTS

| | | | | |
|---|---|---|---|---|
| 5,882,998 | A | * | 3/1999 | Sur et al. ...................... 438/601 |
| 6,362,027 | B1 | * | 3/2002 | Yamazaki et al. ............ 438/149 |
| 2002/0017671 | A1 | * | 2/2002 | Goebel et al. ................. 257/301 |
| 2002/0153160 | A1 | * | 10/2002 | Hofmann et al. .......... 174/117 F |
| 2005/0145928 | A1 | * | 7/2005 | Ogura et al. ................. 257/324 |
| 2007/0105321 | A1 | * | 5/2007 | Lee et al. ...................... 438/270 |
| 2007/0210449 | A1 | * | 9/2007 | Caspary et al. ............... 257/734 |

* cited by examiner

*Primary Examiner* — Minh-Loan T Tran
*Assistant Examiner* — Fei Fei Yeung Lopez
(74) *Attorney, Agent, or Firm* — Harness, Dickey & Pierce, PLC

(57) ABSTRACT

Provided are a wire structure and a semiconductor device having the wire structure. The wire structure includes a first wire that has a first region having a width of several to tens of nanometers and a second region having a width wider than that of the first region.

20 Claims, 4 Drawing Sheets

WIRE STRUCTURE AND SEMICONDUCTOR DEVICE COMPRISING THE WIRE STRUCTURE

This U.S. non-provisional patent application claims the benefit of priority under 35 U.S.C. §119 of Korean Patent Application No. 10-2007-003965, filed on Jan. 12, 2007, in the Korean Intellectual Property Office, the entire content of which is incorporated herein in its entirety by reference.

BACKGROUND

Semiconductor devices have various wires for transmitting signals. For example, semiconductor devices including a transistor have a gate line, a bit line, and other wires. Meanwhile, non-volatile cross-point memory devices may include a plurality of first wires that are formed at equal intervals from each other and a plurality of second wires that may also be formed at equal intervals from each other and cross the first wires.

The widths of the wires have been constantly decreased to achieve a higher integration of devices. Accordingly, the wires may be easily bent or broken as the widths of the wires become smaller (e.g., to tens of nanometers) because the effect of surface tension on the wires largely increases. As the effect of surface tension increases, a great stress may be applied to a certain region of the wires and the wires may be bent or broken.

FIGS. 1A and 1B are scanning electron microscopic (SEM) images showing some of the problems of the conventional techniques.

FIG. 1A shows a gate line 20, having a width of approximately 50 nm, that is bent. FIG. 1B shows a wire 40 having a width of approximately 50 nm, that is cut or broken in the middle. Reference numerals 10, 30a, and 30b denote respectively a substrate, a first impurity region, and a second impurity region.

As a result, nano wires and semiconductor devices having the nano wires cannot be easily manufactured.

SUMMARY

Example embodiments relate to a wire structure in which wire transformation and cutting due to the decrease in the width of the wires may be prevented. Example embodiments may be directed to a semiconductor device including the wire structure.

In an example embodiment, there is provided a wire structure including a first wire. The first wire may have a first region having a width of several to tens of nanometers. A second region of the first wire may have a width wider than that of the first region.

In an example embodiment, there is provided a semiconductor device having a first wire. The first wire may include a first region having a width of several to tens of nanometers. A second region of the feature may have a width wider than that of the first region.

In one example embodiment, the semiconductor device may include a plurality of the first wires. The plurality of the first wires may be disposed in parallel, and ends on one side of the plurality of the first wires may form a zigzag form.

Ends at another side of the plurality of the first wires may also form a zigzag form. The second region may be formed at both ends and/or between the both ends of the first wire.

In an example embodiment, the first wire may include a plurality of the second regions between the both ends of the first wire. The width of the second region may be about 50 nm through about 1 μm. The first wire may also include a plurality of the second regions. The distance between the second regions may be about 50 nm through about 5 μm.

In an example embodiment, the wire structure may further include a second wire formed to cross the first wire. The second wire may include a third region that may have a width of several to tens of nanometers and a fourth region that may have a width wider than that of the third region.

In an example embodiment, the semiconductor device may include a second wire formed to cross the first wire. A second wire may include a third region that may have a width of several to tens of nanometers and a fourth region that may have a width wider than that of the third region.

In an example embodiment, the semiconductor device may include a plurality of the second wires. The plurality of the second wires may be disposed in parallel and ends on one side of the plurality of the second wires may form a zigzag form. Ends on another side of the plurality of second wires may be disposed in a zigzag form.

In an example embodiment, the semiconductor device may include a plurality of the first wires and a plurality of the second wires. The plurality of the first wires and the plurality of the second wires may be respectively disposed in parallel, and ends on one side of the plurality of the first wires and the plurality of the second wires may respectively form a zigzag form. Ends on the other side of the plurality of the first wires and the plurality of the second wires may respectively form a zigzag form.

A fourth region may be formed at both ends and/or between the both ends of the second wire. The second wire may comprise a plurality of the fourth regions formed between the both ends of the second wires. The width of the fourth region may be about 50 nm through about 1 μm. The second wire may include a plurality of the fourth regions and the distance between the fourth regions may be about 50 nm through about 5 μm.

In an example embodiment, the semiconductor device may include a transistor and the first wire may be a gate line of the transistor. The semiconductor device may have a plurality of the first wires and a plurality of the second wires, and storage nodes may be formed at cross-points of the plurality of the first wires and the plurality of the second wires.

In an example embodiment, switching devices may be formed at cross-points of the plurality of the first wires and the plurality of the second wires.

BRIEF DESCRIPTION OF THE DRAWINGS

Example embodiments will be described with reference to the following figures in which like reference numerals refer to like parts throughout the various figures unless otherwise specified. In the figures.

DETAILED DESCRIPTION OF EXAMPLE EMBODIMENTS

Figure 1A:
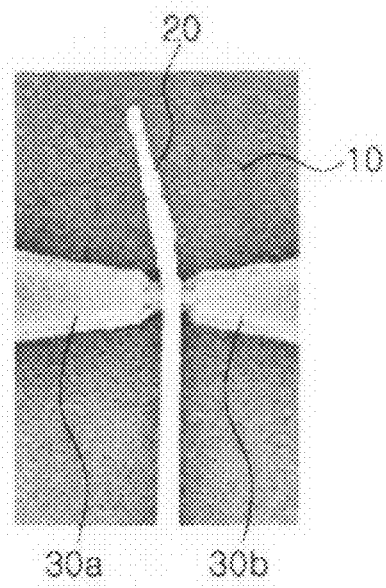
FIGS. 1A and 1B are scanning electron microscopic (SEM) images showing problems of conventional techniques.

Various example embodiments of will now be described more fully with reference to the accompanying drawings, in which exemplary embodiments are shown. In the drawings, the thicknesses of layers or regions illustrated in the drawings may be exaggerated for better understanding of the example embodiments.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 2:
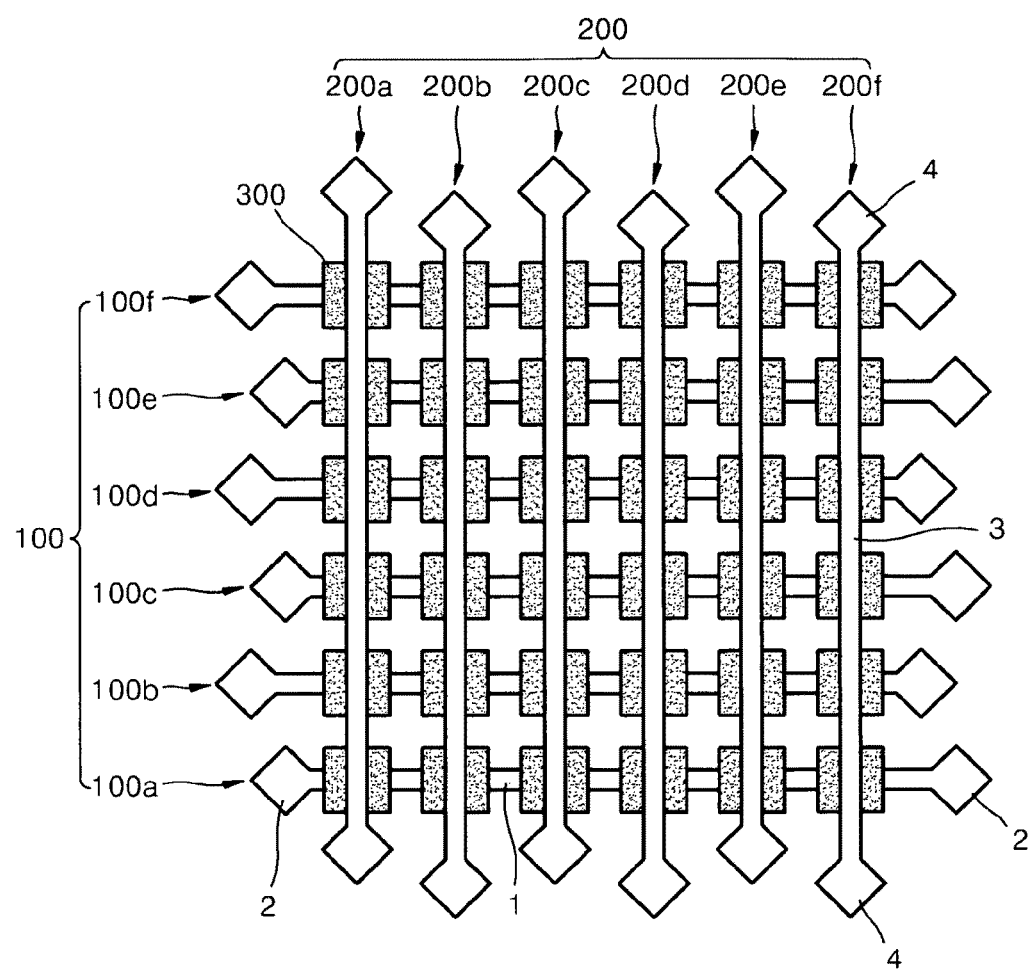
FIG. 2 is a plan view illustrating a semiconductor device according to an example embodiment.

FIG. 2 illustrates a semiconductor device according to an example embodiment. The wire structures according to the example embodiments will be described in conjunction with the semiconductor device of FIG. 2.

Referring to FIG. 2, a plurality of first wires 100 may be formed at equal intervals from each other. A plurality of second wires 200 may also be formed at equal intervals perpendicularly to the first wires 100 and may be spaced from the first wires 100. As illustrated in FIG. 2, the first wires 100a, 100c, and 100e may be disposed so that ends thereof are disposed slightly offset from, or to the right of ends of, the first wires 100b, 100d and 100f. Likewise, the second wires 200a, 200c and 200e may be disposed so that ends thereof are disposed slightly offset from, or higher than, ends of the second wires 200b, 200d, and 200f.

Stack structures 300 in which switching devices and storage nodes may be deposited may be formed at cross-points of the first wires 100 and the second wires 200. The switching devices may, for example, be PN diodes, and the storage nodes may include resistance change layers. The structure and material of the stack structure 300 may vary. For example, in an embodiment, the switching devices and/or the storage nodes may be formed in a line or a plate form instead of a dot form.

The first wires 100 may have a first region 1 and may have a width of several to tens of nanometers and a second region 2 may have a width wider than that of the first region 1. Similarly, the second wires 200 may have a third region 3 and may have a width of several to tens of nanometers and a fourth region 4 may have a width wider than that of the third region 3. The second region 2 and the fourth region 4 may have a tetragonal or a circular shape and the tetragon may be a rhombus. The widths of the first region 1 and the third region 3 may be identical, and the widths and shapes of the second region 2 and the fourth region 4 may be identical. The widths of the first region 1 and the third region 3 may be smaller than 50 nm, and the widths of the second region 2 and the fourth region 4 may be approximately from 50 nm to 1 μm. The second region 2 may support the first region 1 so that the first region 1 is not bent or broken by a stress. Similarly, the fourth region 4 may support the third region 3 so that the third region 3 is not bent or broken by a stress force.

The second region 2 and the fourth region 4 may be formed at ends of the first wires 100 and the second wires 200, respectively. Because the second region 2 and the fourth region 4 may disposed in a zigzag form defined by alternating positioning of the second region 2 and the fourth region 4, the density of the first and the second wires 100 and 200 may not be reduced. The positions for forming of the second region 2 and the fourth region 4 may be changed. For example, the second region 2 and the fourth region 4 may be formed at both ends and/or between both ends of the first and the second wires 100 and 200, respectively. A plurality of second regions 2 and fourth regions 4 may be formed between both ends of the first and the second wires 100 and 200. When the second regions 2 are formed between both ends of the first wires 100, the second regions 2 may be disposed so that the second regions 2 of the first wires 100a, 100c, and 100e are not adjacent to the second regions 2 of the first wires 100b, 100d, and 100f. Likewise, when the fourth regions 4 are formed between both ends of the second wires 200, the fourth regions 4 may be disposed so that the fourth regions 4 of the second wires 200a, 200c, and 200e are not adjacent to the fourth regions 4 of the second wires 200b, 200d, and 200f. Also, the fourth regions 4 may be disposed not to be adjacent to the second regions 2.

The distances between the second regions 2 and the distances between the fourth regions 4 may be approximately 50 nm through 5 μm, and may be 50 nm through 1.5 μm.

Although not illustrated, third wires may be formed a predetermined distance apart from the second wires 200, and switching devices and storage nodes may be formed at cross-points of the second wires 200 and the third wires. Likewise, other wires may be additionally formed above the third wires.

In the semiconductor device of FIG. 2, the second region 2 and the fourth region 4 may prevent nano wires (i.e., the first and the second wires 100 and 200), to which the second region 2 and the fourth region 4 belong from bending or breaking.

Figure 3:
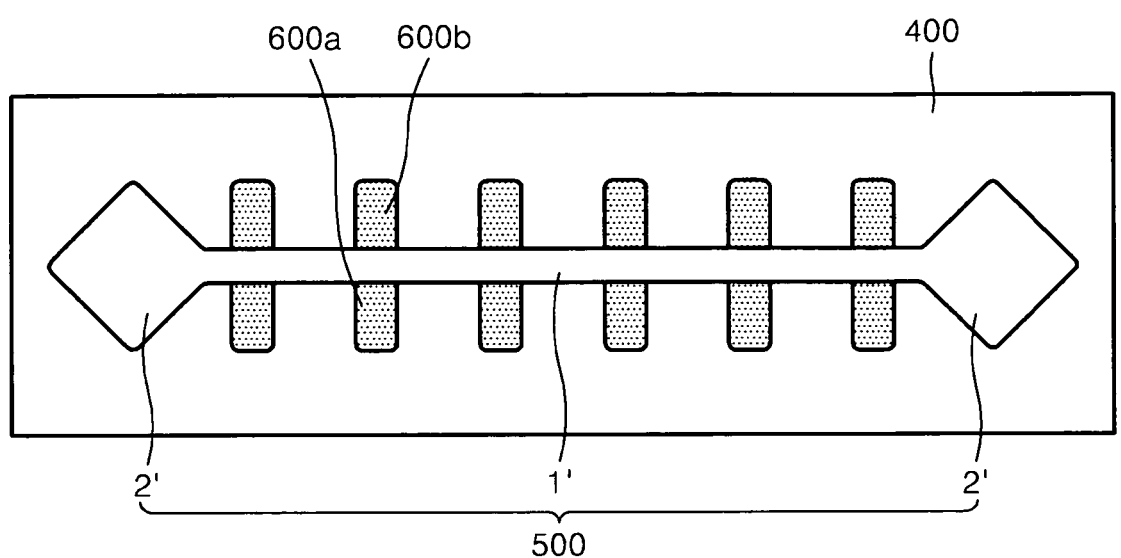
FIG. 3 is a plan view illustrating a semiconductor device according to an example embodiment.

FIG. 3 illustrates a semiconductor device according to an example embodiment.

Figure 1B:
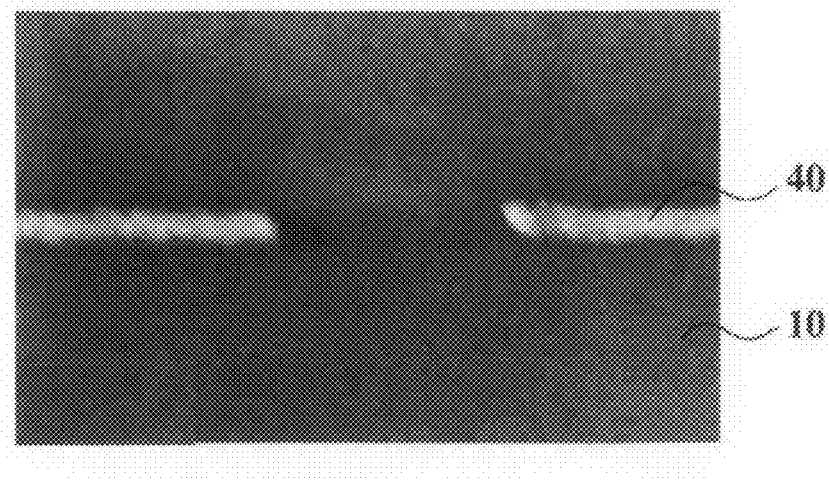

In FIG. 3, a gate line 500 may be formed on a substrate 400, and a plurality of first and second impurity regions 600a and 600b may be formed on both sides of the gate line 500. The gate line 500 and the first and second impurity regions 600a and 600b constitute transistors. The gate line 500 may include a first region 1' that may have a width of several to tens of nanometers and a second region 2' that may have a width wider than that of the first region 1'. The second region 2' may be disposed at both ends of the gate line 500. The form of the positions, shapes, and sizes of the first and the second regions 1' and 2' may be the same as those of the first and the second regions 1 and 2 of the semiconductor device of FIG. 1. The second region 2' may prevent the first region 1' from bending or breaking.

Figure 4A:
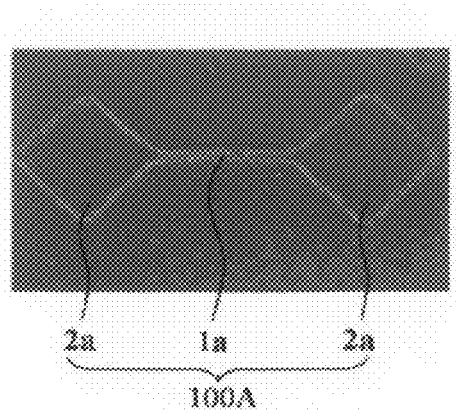
FIGS. 4A through 4C are SEM images showing wires included in semiconductor devices according to example embodiments.
Figure 4B:
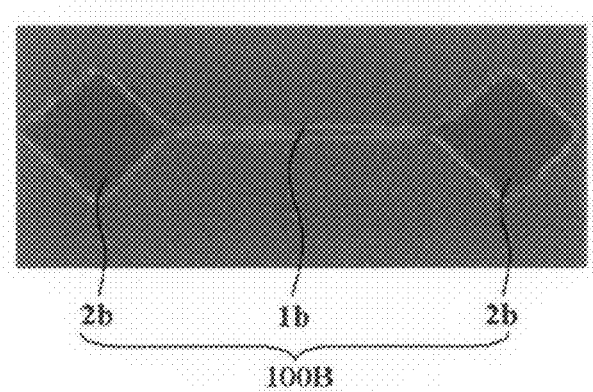
Figure 4C:
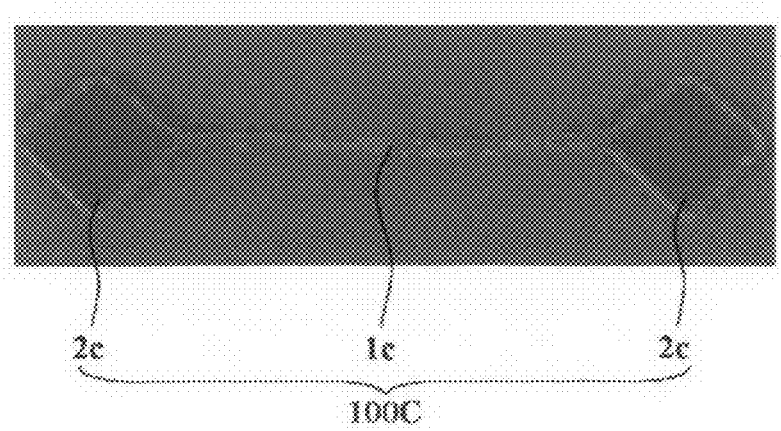

FIGS. 4A through 4C are SEM images showing wires included in semiconductor devices according to example embodiments. The width of the first regions 1a, 1b, and 1c in FIG. 4A through 4C may be about 20 nm. The length of the first region 1a in FIG. 4A may be about 500 nm, the length of the first region 1b in FIG. 4B may be about 1 µm, and the length of the first region 1c in FIG. 4C may be about 1.2 µm.

The first regions 1a, 1b, and 1c may have contiguous line shapes due to the second regions 2a, 2b, and 2c at both ends of the wires 100A, 100B, and 100C.

As described above, the nano wires included in the semiconductor devices according to example embodiments, may have supportive regions (i.e., the second and fourth regions 2 and 4) at both ends and/or at other regions except for the ends of the nano wires, thereby preventing the nano wires from bending or breaking. Thus, nano wires having a width of about 50 nm or less and semiconductor devices having the nano wires may be easily manufactured.

While example embodiments have been particularly shown and described with reference to drawings thereof, it will be understood by those of ordinary skill in the art that various changes in form and details may be made therein. For example, the devices of the example embodiments are not limited to cross-point memory devices, as in FIG. 2, or to transistors, as in FIG. 3, and can be other devices. Thus, the scope of the example embodiments will not be defined by the above embodiments but by the following claims.

What is claimed is:

1. A wire structure including at least one first wire, wherein the at least one first wire comprises:
    a first region having a width of several to tens of nanometers; and
    a second region disposed at both ends of the first region and having a width wider than that of the first region,
    wherein the second region is configured to prevent the first region from at least one of bending and breaking due to a stress,
    the wire structure includes a plurality of first wires in parallel, and
    ends on one side of the plurality of the first wires are offset from one another and are in a zigzag pattern.

2. The wire structure of claim 1, wherein ends on another side of the plurality of first wires are offset from one another and are in a zigzag pattern.

3. The wire structure of claim 1, wherein at least one additional second region is between both ends of the at least one first wire.

4. The wire structure of claim 3, wherein the at least one first wire includes a plurality of the second regions formed between the both ends of the at least one first wire.

5. The wire structure of claim 1, wherein the width of the second region is 50 nm through 1 µm.

6. The wire structure of claim 1, wherein the at least one first wire includes a plurality of the second regions and a distance between the second regions is 50 nm through 5 µm.

7. The wire structure of claim 1, further comprising at least one second wire that crosses the at least one first wire,
    wherein the at least one second wire includes:
        a third region having a width of several to tens of nanometers; and
        a fourth region having a width wider than that of the third region.

8. The wire structure of claim 7, wherein the wire structure comprises a plurality of second wires.

9. The wire structure of claim 8, wherein the plurality of second wires are in parallel, and ends on one side of the plurality of second wires are offset from one another and are in a zigzag pattern.

10. The wire structure of claim 9, wherein ends on another side of the plurality of second wires are offset from one another and are in a zigzag pattern.

11. The wire structure of claim 8, wherein the plurality of first wires and the plurality of second wires are in parallel, and ends on one side of the plurality of first wires and the plurality of second wires are in a zigzag pattern.

12. The wire structure of claim 11, wherein ends on another side of the plurality of first wires and the plurality of second wires are in a zigzag pattern.

13. The wire structure of claim 7, wherein the fourth region is formed at least one of the both ends of the at least one second wire and between the both ends of the at least one second wire.

14. A semiconductor device, comprising the wire structure of claim 1.

15. The semiconductor device of claim 14, wherein the semiconductor device comprises a transistor and the first wire is a gate line of the transistor.

16. The semiconductor device of claim 14, wherein the semiconductor device further includes plurality of second wires, and
    storage nodes are at cross-points between the plurality of first wires and the plurality of second wires.

17. The semiconductor device of claim 16, wherein switching devices are at the cross-points between the plurality of first wires and the plurality of second wires.

18. A wire structure including at least one first wire, the at least one first wire comprising:
    a first region having a width of several to tens of nanometers; and
    a second region disposed at both ends of the first region and having a width wider than that of the first region,
    wherein the second region is configured to prevent the first region from at least one of bending and breaking due to a stress, and
    the at least one first wire further includes a plurality of the second regions between both ends of the at least one first wire.

19. The wire structure of claim 18, further comprising:
    at least one second wire that crosses the at least one first wire,
    wherein the at least one second wire includes
        a third region having a width of several to tens of nanometers, and
        a fourth region having a width wider than that of the third region.

20. A semiconductor device, comprising the wire structure of claim 18.

* * * * *